United States Patent
Song et al.

(10) Patent No.: US 8,609,477 B2
(45) Date of Patent: Dec. 17, 2013

(54) MANUFACTURING METHOD FOR ARRAY SUBSTRATE WITH FRINGE FIELD SWITCHING TYPE THIN FILM TRANSISTOR LIQUID CRYSTAL DISPLAY

(75) Inventors: Youngsuk Song, Beijing (CN); Seungjin Choi, Beijing (CN); Seongyeol Yoo, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/499,353

(22) PCT Filed: Apr. 26, 2011

(86) PCT No.: PCT/CN2011/073336
§ 371 (c)(1),
(2), (4) Date: Mar. 30, 2012

(87) PCT Pub. No.: WO2011/134390
PCT Pub. Date: Nov. 3, 2011

(65) Prior Publication Data
US 2012/0184060 A1 Jul. 19, 2012

(30) Foreign Application Priority Data
Apr. 26, 2010 (CN) .......................... 2010 1 0159005

(51) Int. Cl.
*H01L 21/84* (2006.01)
(52) U.S. Cl.
USPC .................................. 438/158; 257/E21.535
(58) Field of Classification Search
USPC .................................. 438/159; 257/E21.535
See application file for complete search history.

(56) References Cited

U.S. PATENT DOCUMENTS

| 5,472,889 | A | 12/1995 | Kim et al. |
| 6,537,840 | B2 * | 3/2003 | Tseng ........................... 438/158 |
| 7,480,015 | B2 * | 1/2009 | Kim et al. ...................... 438/30 |
| 2009/0021687 | A1 | 1/2009 | Kwack et al. |

FOREIGN PATENT DOCUMENTS

| CN | 101256984 A | 9/2008 |
| CN | 101533191 A | 9/2009 |
| CN | 101661908 A | 3/2010 |

(Continued)

OTHER PUBLICATIONS

International Search Report: mailed Jul. 21, 2011; PCT/CN2011/073336.

(Continued)

*Primary Examiner* — Chandra Chaudhari
(74) *Attorney, Agent, or Firm* — Ladas & Parry LLP

(57) ABSTRACT

A manufacturing method for an array substrate with a fringe field switching (FFS) type thin film transistor (TFT) liquid crystal display (LCD) includes the following steps. A pattern of a gate line (1), a gate electrode, a common electrode (6) and a common electrode line (5) is formed by patterning a first transparent conductive film and a first metal film formed successively on a transparent substrate. Contact holes of the gate line in the pad area and a semiconductor pattern are formed through a patterning process after a gate insulator film, and a semiconductor film and a doped semiconductor film are formed successively. A second metal film is deposited and patterned. A second transparent conductive film is deposited and a lift-off process is performed. And then, a pattern of a source electrode, a drain electrode, a TFT channel and a pixel electrode (4) is formed by etching the exposed second metal film and the doped semiconductor film.

8 Claims, 11 Drawing Sheets

(56) References Cited

FOREIGN PATENT DOCUMENTS

| | | |
|---|---|---|
| JP | 2006-191014 A | 7/2006 |
| JP | 2009-124123 A | 6/2009 |
| KR | 20070096189 A | 10/2007 |
| KR | 20090009697 A | 1/2009 |

OTHER PUBLICATIONS

International Preliminary Report on Patentability; mailed Nov. 8, 2012; Appln. No. PCT/CN2011/073336.
KIPO Notice of Allowance dated Mar. 15, 2013; Appln. No. 10-2012-7003099.

* cited by examiner

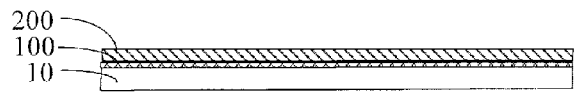
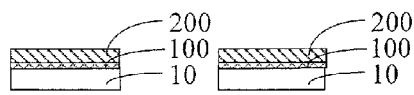
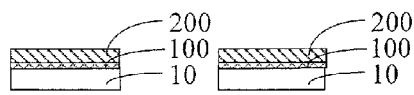
FIG. 3A  FIG. 3B  FIG. 3C
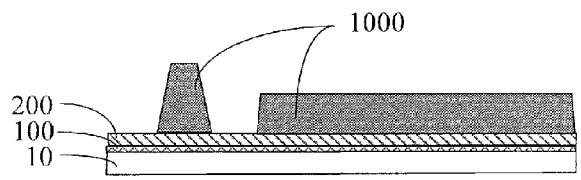
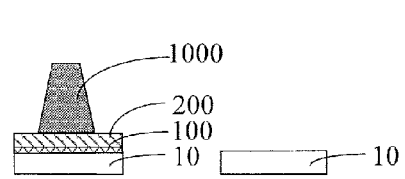
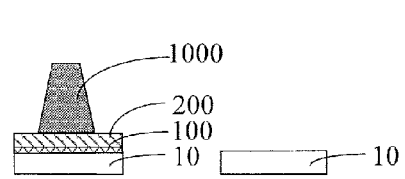
FIG. 4A  FIG. 4B  FIG. 4C
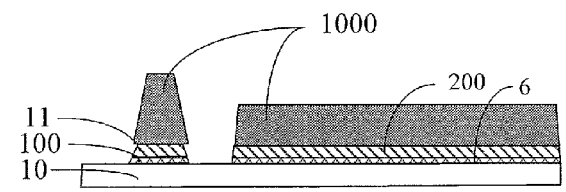
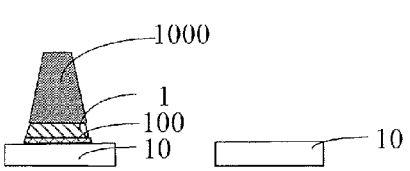
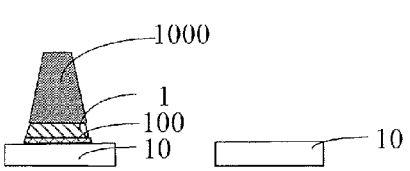
FIG. 5A  FIG. 5B  FIG. 5C
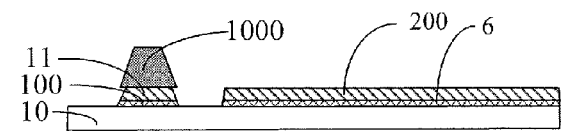
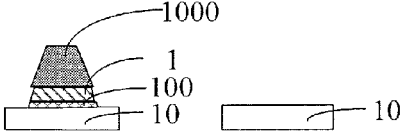
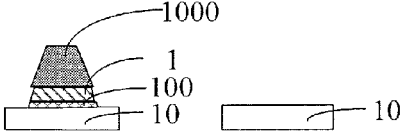
FIG. 6A  FIG. 6B  FIG. 6C
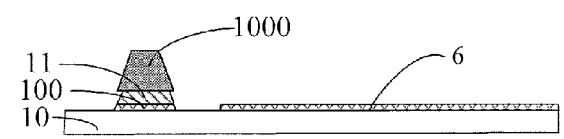
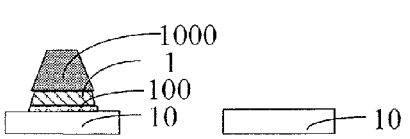
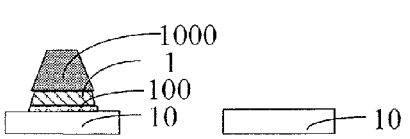
FIG. 7A  FIG. 7B  FIG. 7C
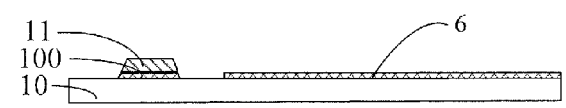
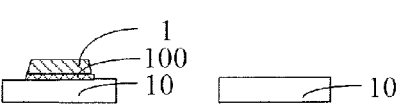
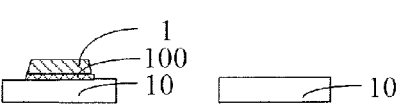
FIG. 8A  FIG. 8B  FIG. 8C

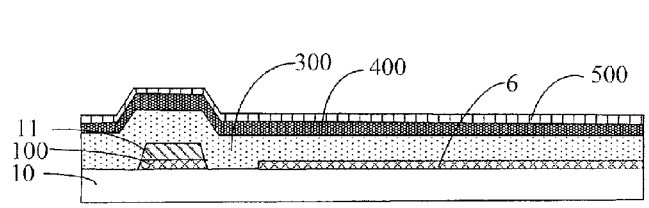
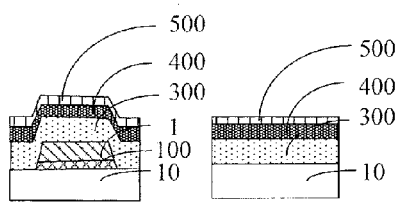
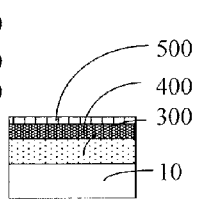
FIG. 9A  FIG. 9B  FIG. 9C
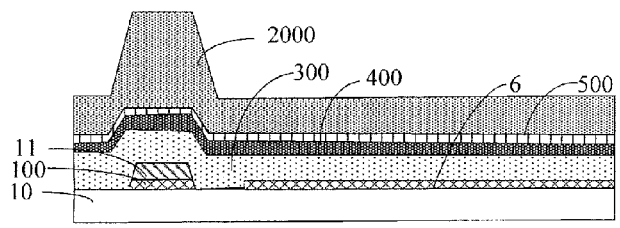
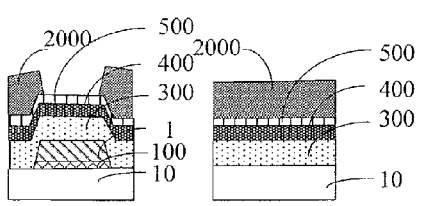
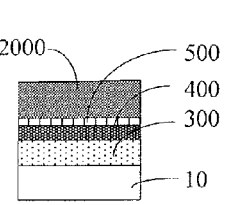
FIG. 10A  FIG. 10B  FIG. 10C
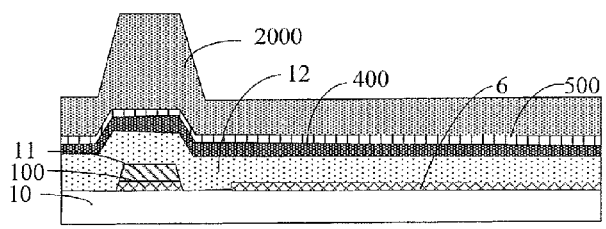
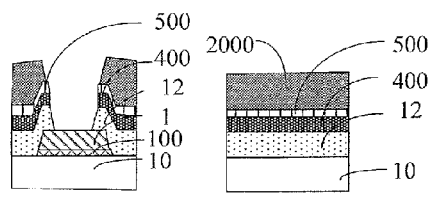
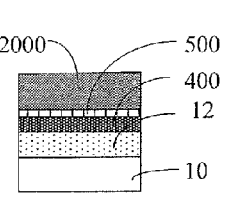
FIG. 11A  FIG. 11B  FIG. 11C
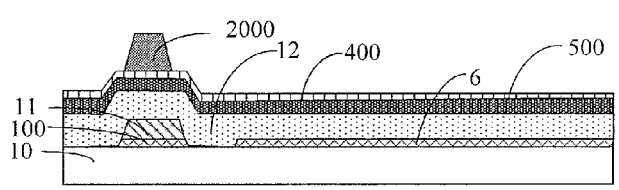
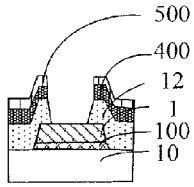
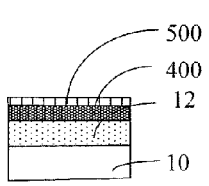
FIG. 12A  FIG. 12B  FIG. 12C
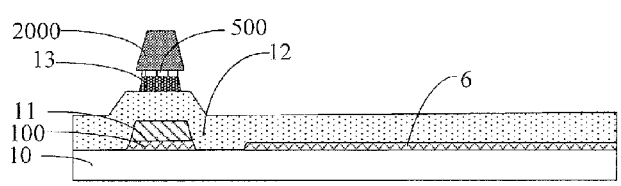
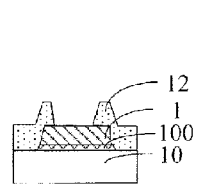
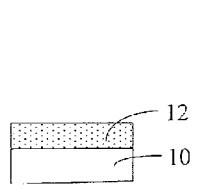
FIG. 13A  FIG. 13B  FIG. 13C

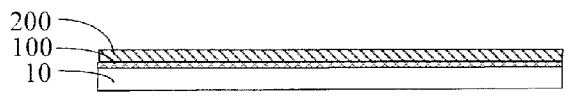 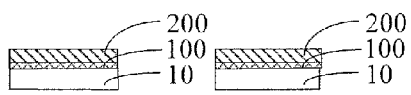 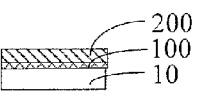
FIG. 23A  FIG. 23B  FIG. 23C
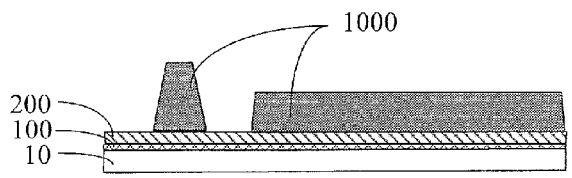 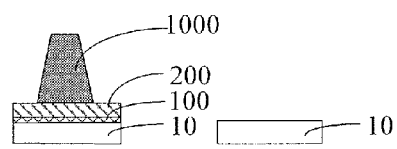 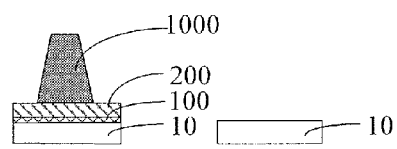
FIG. 24A  FIG. 24B  FIG. 24C
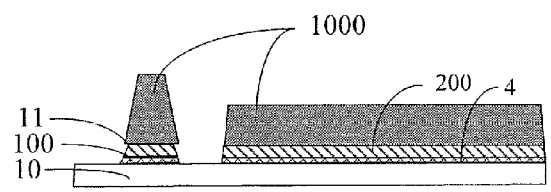 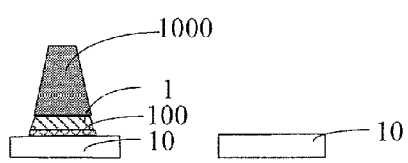 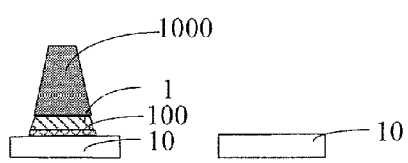
FIG. 25A  FIG. 25B  FIG. 25C
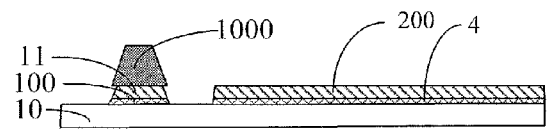 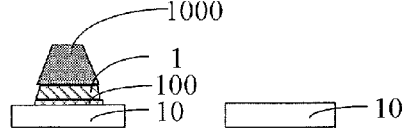 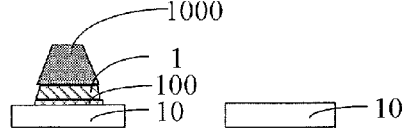
FIG. 26A  FIG. 26B  FIG. 26C
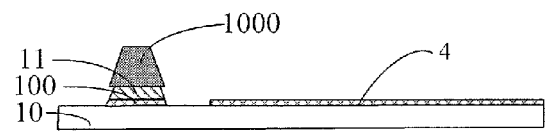 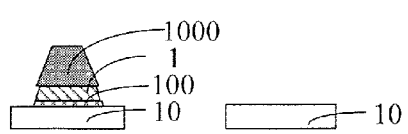 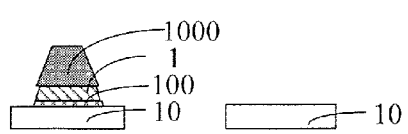
FIG. 27A  FIG. 27B  FIG. 27C
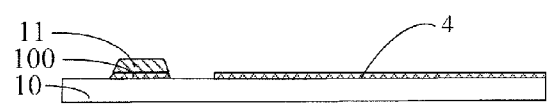 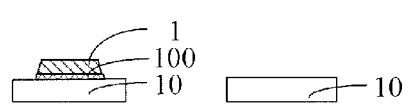 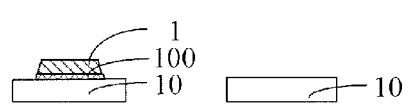
FIG. 28A  FIG. 28B  FIG. 28C

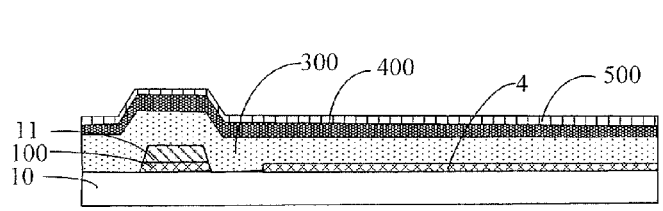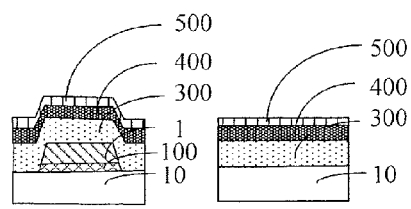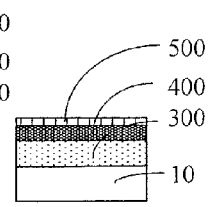
FIG. 29A     FIG. 29B     FIG. 29C
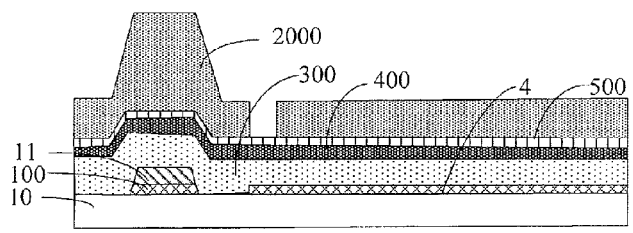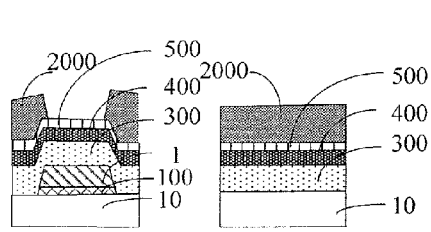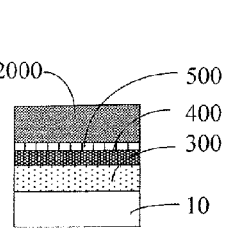
FIG. 30A     FIG. 30B     FIG. 30C
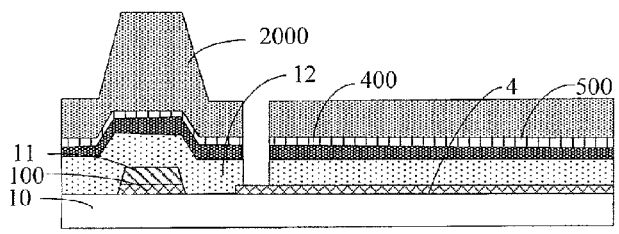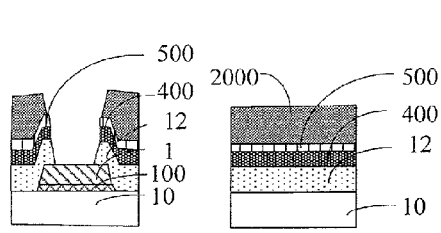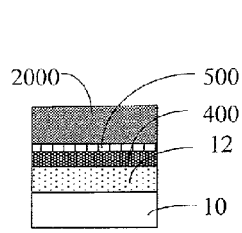
FIG. 31A     FIG. 31B     FIG. 31C
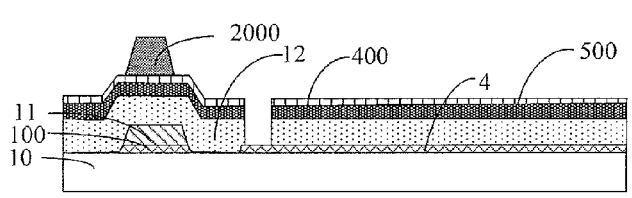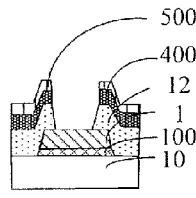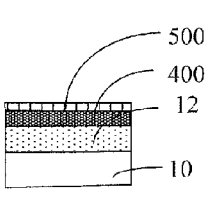
FIG. 32A     FIG. 32B     FIG. 32C
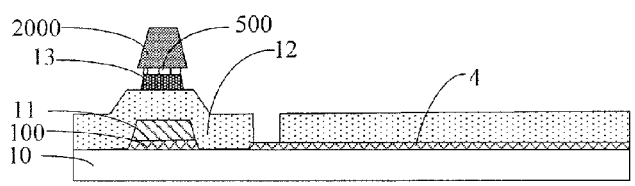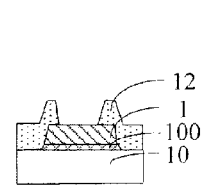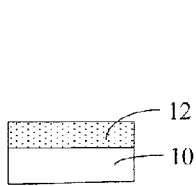
FIG. 33A     FIG. 33B     FIG. 33C

US 8,609,477 B2

MANUFACTURING METHOD FOR ARRAY SUBSTRATE WITH FRINGE FIELD SWITCHING TYPE THIN FILM TRANSISTOR LIQUID CRYSTAL DISPLAY

TECHNICAL FIELD

The present invention relates to a method for manufacturing an array substrate of a fringe-field switching (FFS) type thin film transistor liquid crystal display (TFT-LCD).

BACKGROUND

Thin film transistor liquid crystal display devices (TFT-LCDs) are a main kind of flat panel display devices (FPDs).

Based on the direction of the electrical field for driving the liquid crystal material, TFT-LCDs can be divided into a vertical field type and a horizontal field type. For the vertical field type TFT-LCDs, it is necessary to form pixel electrodes on an array substrate and form common electrodes on a color filter substrate. However, for the horizontal field type TFT-LCD, it is necessary to form both pixel electrodes and common electrodes on the array substrate. As a result, during manufacturing the array substrate of a horizontal field type TFT-LCD, as compared with the array substrate of a vertical field type TFT-LCD, one additional masking process for forming the common electrodes is required. The vertical field type TFT-LCDs include twist nematic (TN) type TFT-LCDs; the horizontal field type TFT-LCDs include fringe field switching (FFS) type TFT-LCDs and in-plane switching (IPS) type TFT-LCDs. The horizontal field type TFT-LCDs, especially FFS type TFT-LCDs, have advantages of wide viewing angle, high aperture ratio and the like, and are applied widely to the field of the liquid crystal display device.

Currently, the array substrate of an FFS type TFT-LCD is manufactured by forming structural patterns with a plurality of patterning processes, each of which in turn comprises processes of exposing photoresist by using a mask, developing, etching, removing the remaining photoresist, and the like. The etching process may comprise dry etching and wet etching. Therefore, the complexity of the process for manufacturing the array substrate of a TFT-LCD is evaluated by the number of patterning processes, and thus reducing of the number of pattern processes would result in a decreased cost. The six-pattern-process for manufacturing the array substrate of an FFS type TFT-LCD in the prior art comprises: patterning of a common electrode, patterning of gate lines and gate electrodes, patterning of an active layer, patterning of source electrodes/drain electrodes, patterning of via holes, and patterning of pixel electrodes.

The four-pattern-processes in the prior art for manufacturing the array substrate of an FFS type TFT-LCD is conducted as follows.

Step 1, depositing a first metal film, and forming patterns of gate lines, common electrodes and gate electrodes by a first patterning process by using an ordinary mask plate;

Step 2, depositing a gate insulating film and an active layer (a semiconductor layer and an impurity-doped semiconductor layer) film, and forming patterns of the active layer by a second patterning process by using an ordinary mask plate;

Step 3, sequentially depositing a first transparent conductive film and a second metal film, and forming patterns of pixel electrodes, source electrodes, drain electrodes and TFT channels by a third patterning process by using a dual-tone mask plate; and Step 4, depositing a passivation layer and a second transparent conductive layer, and forming patterns of the passivation layer, connection holes (for connecting the common electrodes and the common electrode lines), connection holes in a PAD region (the PAD region is a region for bonding wires of a driving circuit board to the array substrate, and the wires can be connected electrically to the gate lines, the data lines, the common electrode lines and the like through the connection holes in the PAD region), and the common electrodes by a fourth patterning process by using a dual-tone mask plate.

SUMMARY

According to one embodiment of the invention, a method for manufacturing an array substrate of an FFS type TFT-LCD is provided. The method comprises: step 1: forming a first transparent conductive film and a first metal film on a transparent substrate sequentially, and then patterning the stack of the first transparent conductive film and the first metal film so as to form patterns including gate lines, gate electrodes, common electrodes and common electrode lines; step 2: forming a gate insulating film, a semiconductor film and an impurity-doped semiconductor film sequentially, and then patterning the stack of the gate insulating film, the semiconductor film and the impurity-doped semiconductor film so as to form patterns including gate connection holes in the PAD region and a semiconductor layer; step 3: forming a second metal film, patterning the second metal film, then forming a second transparent conductive film and performing a lifting-off process so as to remove the second transparent conductive film on photoresist, and etching the exposed second metal film and the impurity-doped semiconductor film so as to form patterns including source electrodes, drain electrodes, TFT channels and pixel electrodes.

According to another embodiment, a method for manufacturing an array substrate of an FFS type TFT-LCD is provided. The method comprises: Step 100: forming a first transparent conductive film and a first metal film on a transparent substrate sequentially, and then patterning the stack of the first transparent conductive film and the first metal film so as to form patterns including gate lines, gate electrodes, pixel electrodes and common electrode lines; Step 200: forming a gate insulating film, a semiconductor film and an impurity-doped semiconductor film sequentially, and then patterning the stack of the gate insulating film, the semiconductor film and the impurity-doped semiconductor film so as to form patterns including via holes, gate connection holes in the PAD region and a semiconductor layer; Step 300: depositing a second metal film, patterning the second metal film, then depositing a second transparent conductive film and performing a lifting-off process so as to remove the second transparent conductive film on photoresist, and etching the exposed second metal film and the impurity-doped semiconductor film so as to form patterns including source electrodes, drain electrodes, TFT channels and common electrodes.

BRIEF DESCRIPTION OF THE DRAWINGS

FIGS. 3A to 3C are cross-sectional views after depositing a first transparent conductive film and a first metal film on a transparent substrate, in which FIG. 3A shows a cross-sectional view of a pixel region, FIG. 3B shows a cross section of the gate lines in the PAD region, FIG. 3C shows a cross section of the data lines in the PAD region;

FIGS. 4A to 4C are cross-sectional views after performing exposure and development processes with respect to the structure in FIGS. 3A to 3C applied with photoresist;

FIGS. 5A to 5C are cross-sectional views after performing a first etching process with respect to the structure in FIGS. 4A to 4C;

FIGS. 6A to 6C are cross-sectional views after performing an ashing process with respect to the photoresist in FIGS. 5A to 5C;

FIGS. 7A to 7C are cross-sectional views after performing a second etching process with respect to the structure in FIGS. 6A to 6C;

FIGS. 8A to 8C are cross-sectional views after peeling off the photoresist in FIGS. 7A to 7C;

FIGS. 9A to 9C are cross-sectional views after depositing a gate insulating film, a semiconductor film and an impurity-doped semiconductor film on the structure in FIGS. 8A to 8C;

FIGS. 10A to 10C are cross-sectional views after performing exposure and development processes with respect to the structure in FIGS. 9A to 9C applied with photoresist;

FIGS. 11A to 11C are cross-sectional views after performing a third etching process with respect to the structure in FIGS. 10A to 10C;

FIGS. 12A to 12C are cross-sectional views after performing an ashing process with respect to the photoresist in FIGS. 11A to 11C;

FIGS. 13A to 13C are cross-sectional views after performing a fourth etching process with respect to the structure in FIGS. 12A to 12C;

FIGS. 23A to 23C are cross-sectional views after depositing a first transparent conductive film and a first metal film on a transparent substrate, in which FIG. 23A shows a cross-sectional view of a pixel region, FIG. 23B shows a cross section of the gate lines in the PAD region, FIG. 23C shows a cross section of the data lines in the PAD region;

FIGS. 24A to 24C are cross-sectional views after performing exposure and development processes with respect to the structure in FIGS. 23A to 23C applied with photoresist;

FIGS. 25A to 25C are cross-sectional views after performing a first etching process with respect to the structure in FIGS. 24A to 24C;

FIGS. 26A to 26C are cross-sectional views after performing an ashing process with respect to the photoresist in FIGS. 25A to 25C;

FIGS. 27A to 27C are cross-sectional views after performing a second etching process with respect to the structure in FIGS. 26A to 26C;

FIGS. 28A to 28C are cross-sectional views after peeling off the photoresist in FIGS. 27A to 27C;

FIGS. 29A to 29C are cross-sectional views after depositing a gate insulating film, a semiconductor film and an impurity-doped semiconductor film on the structure in FIGS. 28A to 28C;

FIGS. 30A to 30C are cross-sectional views after performing exposure and development processes with respect to the structure in FIGS. 29A to 29C applied with photoresist;

FIGS. 31A to 31C are cross-sectional views after performing a third etching process with respect to the structure in FIGS. 30A to 30C;

FIGS. 32A to 32C are cross-sectional views after performing an ashing process with respect to the photoresist in FIGS. 31A to 31C;

FIGS. 33A to 33C are cross-sectional views after performing a fourth etching process with respect to the structure in FIGS. 32A to 32C;

DETAILED DESCRIPTION

Hereinafter, embodiments of the invention will be described in detail with reference to the accompanying drawings so that the objectives, technical solutions and advantages of the embodiments of the invention will become more apparent. It should be noted that the embodiments described below merely are a portion of but not all of the embodiments of the invention, and those skilled in the relevant art may obtain other embodiments on basis of the described embodiments without creative work, and these embodiments are still within the spirit and scope of the invention.

In the four-pattern-processes of the method for manufacturing the array substrate of a liquid crystal display device in the prior art, although patterns of the pixel electrodes, the source electrodes, the drain electrodes and the TFT channels are obtained by one patterning process, the inventors during practice of the method noted that this can result in a defect of decreasing the display performance of the liquid crystal display device.

Figure 1A:
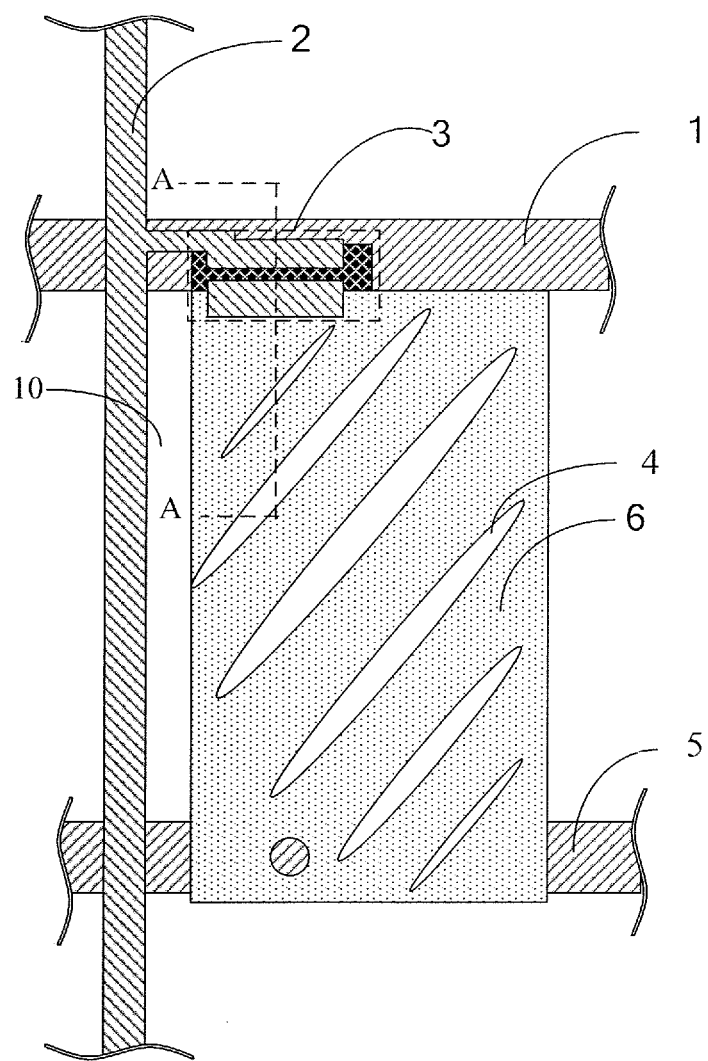
FIG. 1A is a plan schematic view showing an array substrate of an FFS type TFT LCD.

In the following, this defect is described with reference to FIGS. 1A and 1B. FIG. 1A is a plan schematic view showing an array substrate of an FFS type TFT LCD in the prior art, and FIG. 1B is a cross-sectional view taken along a line A-A in FIG. 1A.

As shown in FIG. 1A, the array substrate of an FFS type TFT-LCD comprises gate lines 1, data lines 2, thin film transistors (TFTs) 3, pixel electrodes 4, common electrodes 6, and common electrode lines 5. The gate lines 1 are disposed laterally on a transparent substrate 10, the data lines 2 are disposed longitudinally on the transparent substrate 10, and the TFTs 3 are disposed on the positions where the gate lines 1 and the data lines 2 intersect with one another. The TFTs 3 are active switching elements. The pixel electrodes 4 are plate-like electrodes. The common electrodes 6 are slit electrodes. The common electrodes 6 are located below the pixel electrodes 4 and overlap with the pixel electrodes 4 so that the common electrodes 6 and the pixel electrodes 4 can form an electric field for driving the liquid crystal. The common electrode lines 5 are connected to the common electrodes 6 through connection holes. It should be noted that, in FIG. 1A, what the reference numeral "4" refers to is the plate-like pixel electrodes below the slits rather than the strip slits themselves.

Figure 1B:
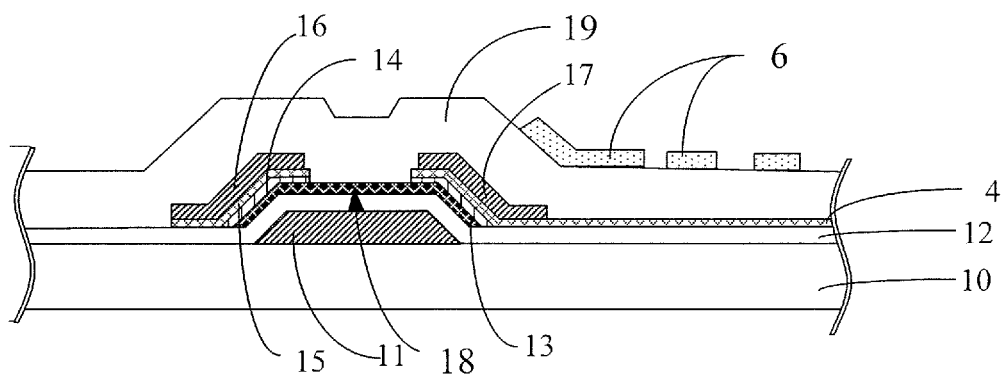
FIG. 1B is a cross-sectional view taken along a line A-A in FIG. 1A.

As shown in FIG. 1B, the array substrate of the FFS type TFT-LCD further comprises: the transparent substrate 10, the pixel electrodes 4, common electrodes 6, gate electrodes 11, a gate insulating layer 12, an active layer (including a semiconductor layer 13 and an impurity-doped semiconductor layer 14), first transparent conductive portions 15, source electrodes 16, drain electrodes 17, TFT channels 18, and a passivation layer 19. The gate electrodes 11 and the gate lines 1 are fainted integrally, the source electrodes 16 and the data lines 2 are formed integrally, and the drain electrodes 17 and the pixel electrodes 4 are connected directly. When a turning-on signal is input to a gate line 1, the active layer becomes electrically conductive, thus a data signal over a data line 2 can be transmitted from the source electrode 16 through the TFT channel 18 to the drain electrode 17, and is input to the pixel electrode 4. After receiving of the signal, the pixel electrode 4 together with the common electrode 6 can generate an electric field for driving the liquid crystal to rotate. Since the common electrode 6 has slits, a horizontal field is generated between the pixel electrode 4 and the common electrode 6.

It can be seen from FIG. 1B that, between the source electrode 16 and the active layer, there is a transparent conductive portion 15 (a portion left when the transparent conductive film is etched to form the pixel electrode) deposited for forming the pixel electrode. In the field of the liquid crystal display device, the pixel electrode is made of indium tin oxide (ITO) or indium zinc oxide (IZO), but this kind of material has a poor conduction as compared with a metal material, thus it may block the transmittance of signal from the source electrode to the active layer, which affects the responding time of the liquid crystal display device and the displaying quality of the liquid crystal display device.

Figure 2:
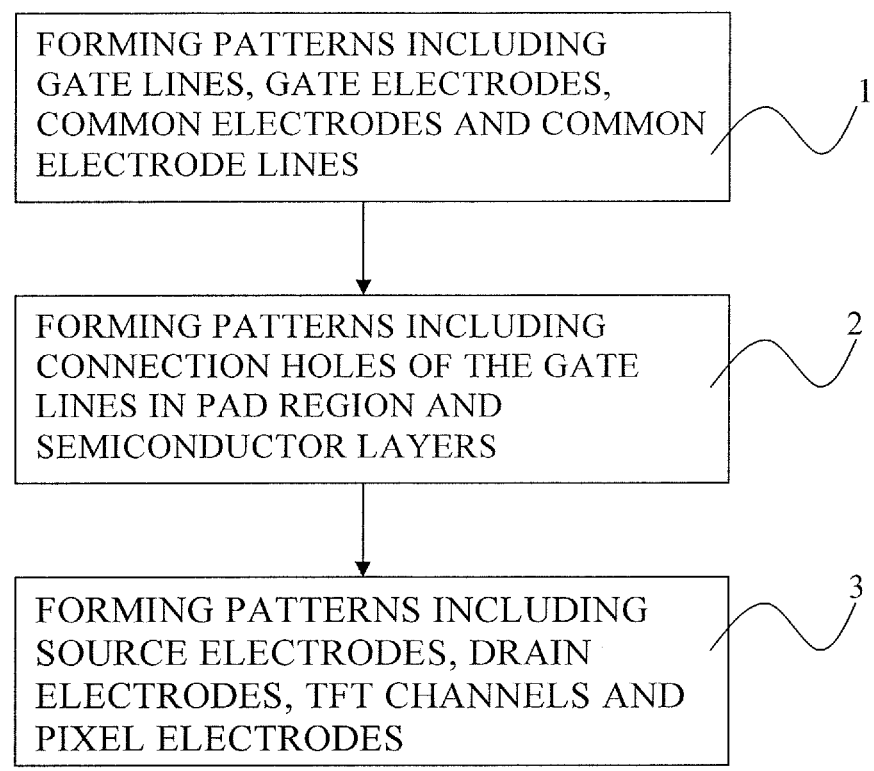
FIG. 2 is a flow chart of a method for manufacturing an array substrate of an FFS type TFT-LCD according to a first embodiment of the invention.

FIG. 2 is a flow chart showing a method for manufacturing an array substrate of an FFS type TFT-LCD according to a first embodiment of the invention. As shown in FIG. 2, the method for manufacturing the array substrate of the FFS type TFT-LCD according to the first embodiment of the invention comprises:

Step 1: forming a first transparent conductive film and a first metal film on a transparent substrate sequentially, and then patterning the stacked layers of the first transparent conductive film and the first metal film so as to form patterns including gate lines, gate electrodes, common electrodes and common electrode lines;

Step 2: forming a gate insulating film, a semiconductor film and an impurity-doped semiconductor film sequentially, and then patterning the stack of the gate insulating film, the semiconductor film and the impurity-doped semiconductor film so as to form patterns including gate connection holes in the PAD region and a semiconductor layer; and Step 3: forming a second metal film, patterning the second metal film, then forming a second transparent conductive film and performing a lifting-off process so as to remove the second transparent conductive film on photoresist, and etching the exposed second metal film and the impurity-doped semiconductor film so as to form patterns including source electrodes, drain electrodes, TFT channels and pixel electrodes.

In the method for manufacturing the array substrate of the FFS type TFT-LCD according to the embodiment of the invention, the array substrate of the FFS type TFT-LCD is fabricated by using three patterning processes. The number of the processes is reduced so that the cost is reduced and the market competitive power can be improved.

In the following, an example of the method for manufacturing the array substrate of the FFS type TFT-LCD according to the first embodiment of the invention is described in details with reference to FIGS. 3A to 21C.

Firstly, a first patterning process of the method for manufacturing the array substrate of the FFS type TFT-LCD according to the first embodiment of the invention is described in details with reference to FIGS. 3A to 8C. The first patterning process comprises the following steps:

Step 11: depositing a first transparent conductive film 100 and a first metal film 200 on a transparent substrate 10 sequentially, as shown in FIGS. 3A to 3C.

The first transparent conductive film 100 and the first metal film 200 can be deposited sequentially on the transparent substrate 10 (for example, a glass substrate or a silica substrate) by using a plasma enhanced chemical vapor deposition (PECVD), magnetism controlled sputter, thermal evaporation or the other film-forming method. The first transparent conductive film 100 can be made of transparent conductive material such as ITO, IZO or the like. The first metal film 200 can be a single layer film of a metal such as Molybdenum, Aluminum, Neodymium and Aluminum alloy, Tungsten, Chromium, Copper or the like, or multiple layers film by depositing the above metals in layers.

Step 12: applying a layer of photoresist 1000 on the structure in FIGS. 3A to 3C firstly, and performing an exposing and developing process by using a first half tone mask so as to obtain the photoresist pattern as shown in FIGS. 4A to 4C. The mask used in this step is a dual tone mask (for example, a half tone mask or a gray tone mask). The half tone mask can be divided into a transparent region, a semi-transparent region and an opaque region according to the transmission ratio or intensity of light. After performing an exposure process by using the half tone mask, the photoresist 1000 is formed with a totally exposed region, a partially exposed region and an unexposed region. Then, after performing a development process, the photoresist in the totally exposed region is washed out by a solution; for the photoresist in the partially exposed region, the upper layer is exposed and then washed out, thus the lower layer of the photoresist is left so that the thickness of the photoresist is decreased; the thickness of the photoresist in the unexposed region remains. In the photoresist 1000, the unexposed region corresponds to the regions of the gate lines, the gate electrodes and the common electrode lines of the array substrate; the partially exposed region corresponds to the region of the common electrodes of the array substrate, and the totally exposed region corresponds to the other regions of the array substrate.

Step 13: performing a first etching process with respect to the structure in FIGS. 4A to 4C to form patterns including the gate lines 1, the gate electrodes 11, the common electrodes 6 and the common electrode lines (not shown), as shown in FIGS. 5A to 5C. The first etching process can comprise a two-stage etching. The first stage is to etch the first metal film 200 to obtain patterns of the gate lines 1, the gate electrodes 11 and the common electrode lines by using a solution (for example, a mixture of phosphorous acid and nitric acid) for etching the metal material. In the actually producing, the wet etching for etching the pattern having a large area is to immerse the object to be etched into an etching solution so that the exposed portions of the object to be etched are etched away by the etching solution. The solution for etching the metal material can etch off only the metal, i.e. the firs metal film, thus the regions covered by the photoresist, i.e., the first metal film in the partially exposed region and the unexposed region, are not etched. Only the first metal film in the totally exposed region are etched off because of direct contact with the etching solution, and the patterns of the gate lines, the gate electrodes and the common electrode lines are formed by the residual first metal film. The second stage is to etch the first transparent conductive film 100 by using a solution for etching ITO or IZO so as to form a pattern of the common electrodes 6. In addition, it should be avoided that the gate lines, the gate electrodes and the common electrode lines are connected electrically via the first transparent conductive film 100.

Step 14: performing an ashing process with respect to the photoresist 1000 in FIGS. 5A to 5C to expose the first metal film 200 in the partially exposed region, as shown in FIGS. 6A to 6C. The ashing process has a function of removing a certain thickness of the photoresist. In this step, the removed photoresist has the same thickness as the thickness of the photoresist in the partially-exposed region in the step 12. That is, after the ashing process, the photoresist remains in the unexposed region, and no photoresist is left in other regions.

Step 15: performing a second etching process with respect to the structure in FIGS. 6A to 6C to remove the first metal film 200 exposed in the step 14, as shown in FIGS. 7A to 7C. The second metal film 200 above the common electrodes 6 is removed to expose the common electrodes 6.

Step 16: removing the residual photoresist 1000 in the structure in FIGS. 7A to 7C, as shown in FIGS. 8A to 8C.

The first patterning process is completed through the steps 11 to 16.

In the following, a second patterning process of the method for manufacturing the array substrate of the FFS type TFT-LCD according to the first embodiment of the invention is described in details with reference to FIGS. 9A to 14C. The second patterning process can comprise the following steps:

Step 21: depositing a gate insulating film 300, a semiconductor film 400 and an impurity-doped semiconductor film 500 on the structure in FIGS. 8A to 8C, as shown in FIGS. 9A to 9C.

Step 22: applying a layer of photoresist 2000 to the structure in FIGS. 9A to 9C, and performing an exposing and developing process by using a second half tone mask to obtain the photoresist patterns as shown in FIGS. 9A to 9C. In the photoresist 2000, the unexposed region corresponds to a region of the TFT channels, the totally exposed region corresponds to a region of the gate lines in the PAD region of the array substrate, and the partially exposed region corresponds to the other regions. The so-called PAD region is a bonding region, i.e. a region for bonding the gate lines, the data lines, the common electrode lines and the other signal lines of the array substrate to be formed and wires of an external driving circuit board, including the gate lines in the PAD region, the data lines in the PAD region and the common electrode lines in the PAD region. The PAD region is located on one side or adjacent two sides of four sides of the array substrate. The signal lines in the PAD region can not be covered by any insulation film in order to connect electrically the wires to the signal lines. Generally, connection holes are formed by etching above the signal lines for exposing the signal lines or connecting the signal lines to conductive elements.

Step 23: performing a third etching process with respect to the structure in FIGS. 10A to 10C to remove the impurity-doped semiconductor film 500, the semiconductor film 400 and the gate insulating film 300 in the totally exposed region of the photoresist 2000, expose the gate lines 1 in the PAD region and form patterns of connection holes of the gate lines in the PAD region and the gate insulating layer 12, as shown in FIGS. 11A to 11C. The third etching process comprises a three-stages etching. The first stage is to remove the exposed impurity-doped semiconductor film 500, the second stage is to remove the exposed semiconductor film 400, and the third stage is to remove the exposed gate insulating film 300 so as to faun patterns of the gate insulating layer 12. The solution and the method used in the etching process can be any one of conventional methods in this field and thus the detailed description is omitted.

Step 24: performing an ashing process with respect to the photoresist 2000 in FIGS. 11A to 11C, to expose the impurity-doped semiconductor film 500 in the partially exposed region, as shown in FIGS. 12A to 12C. In this step, the ashing process can remove the photoresist 2000 in the partially exposed region in the step 22 to expose the impurity-exposed semiconductor film 500 in the partially-exposed region and remain the photoresist in the unexposed region.

Step 25: performing a fourth etching process with respect to the structure in FIGS. 12A to 12C to remove the impurity-doped semiconductor film 500, the semiconductor film 400 and the gate insulating film 300 in the partially exposed region and form patterns including the semiconductor layer 13, as shown in FIGS. 13A to 13C.

Figures 14A, 14B, 14C:
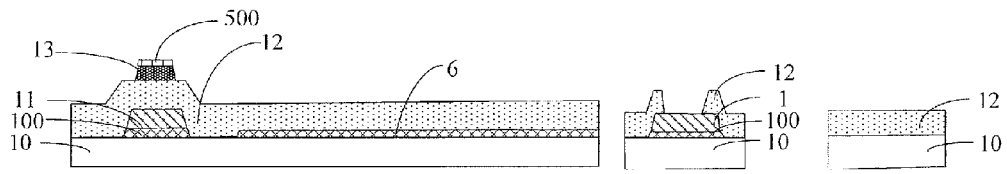
FIGS. 14A to 14C are cross-sectional views after peeling off the photoresist in FIGS. 13A to 13C.

Step 26: peeling off the residual photoresist 2000 in FIGS. 13A to 13C, as shown in FIGS. 14A to 14C.

The second patterning process is completed through the steps 21 to 26.

Figures 15A, 15B, 15C:
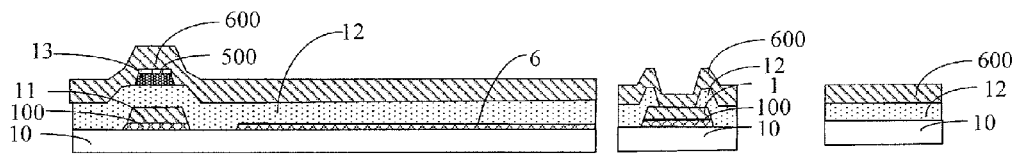
FIGS. 15A to 15C are cross-sectional views after depositing a second metal film on the structure in FIGS. 14A to 14C.

In the following, a third patterning process of the method for manufacturing the array substrate of the FFS type TFT-LCD according to the first embodiment of the invention is described in details with reference to FIGS. 15A to 21C. The third patterning process can comprise the following steps:

Step 31: deposition a second metal film 600 on the structure in FIGS. 14A to 14C, as shown in FIGS. 15A to 15C.

Figures 16A, 16B, 16C:
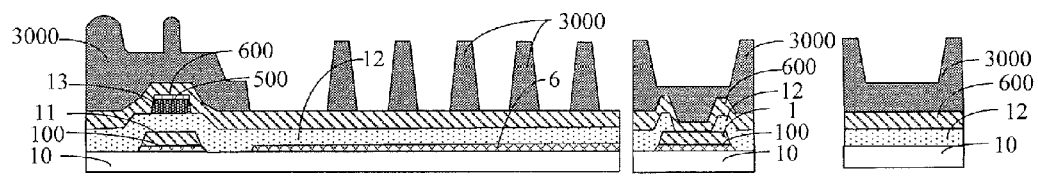
FIGS. 16A to 16C are cross-sectional views after performing exposure and development processes with respect to the structure in FIGS. 15A to 15C applied with photoresist.

Step 32: applying a layer of photoresist 3000 on the structure in FIGS. 15A to 15C, and performing an exposing and developing process by using a third half tone mask to obtain the photoresist patters as shown in FIGS. 16A to 16C. In the photoresist 3000, the totally exposed region corresponds to a region of the pixel electrodes 4 (see FIG. 1) of the array substrate, the partially exposed region corresponds to regions of the source electrodes 16 (see FIG. 1B), the drain electrodes 17 and the gate lines 1 in the PAD region, the data lines 2 in the PAD region (see FIG. 1A) and the common electrode lines in the PAD region, and the unexposed region corresponds to the other regions.

Figures 17A, 17B, 17C:
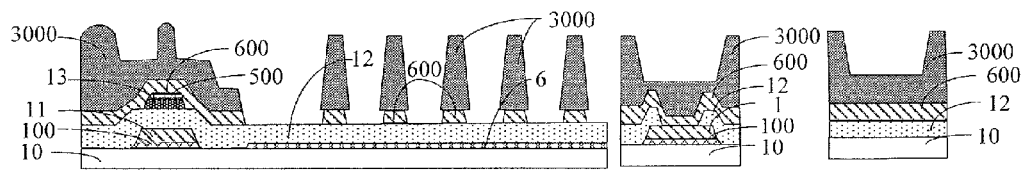
FIGS. 17A to 17C are cross-sectional views after performing a fifth etching process with respect to the structure in FIGS. 16A to 16C.

Step 33: performing a fifth etching process with respect to the structure in FIGS. 16A to 16C to remove the second metal film 600 in the totally exposed region, as shown in FIGS. 17A to 17C.

Figures 18A, 18B, 18C:
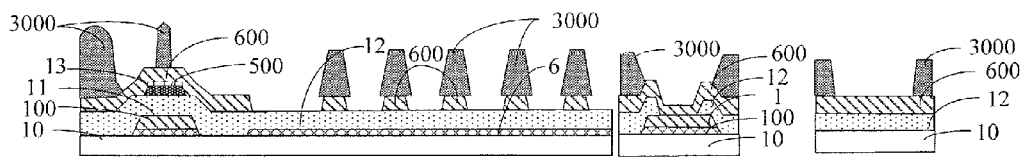
FIGS. 18A to 18C are cross-sectional views after performing an ashing process with respect to the photoresist in FIGS. 17A to 17C.

Step 34: performing an ashing process with respect to the photoresist 3000 in FIGS. 17A to 17C to expose the second metal film 600 in the partially exposed region, as shown in FIGS. 18A to 18C. In the step, the ashing process can remove the photoresist 3000 in the partially exposed region in the step 32 to expose the second metal film 600 in the partially-exposed region and remain the photoresist in the unexposed region.

Figures 19A, 19B, 19C:
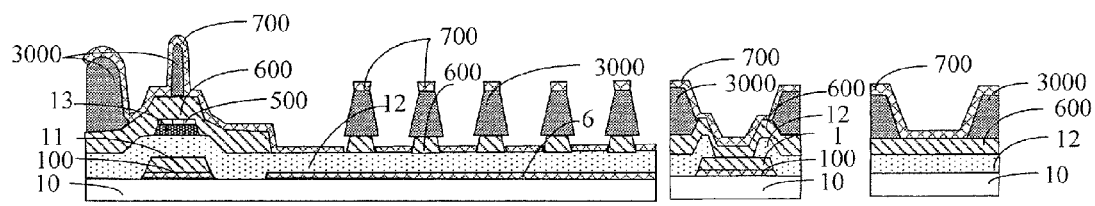
FIGS. 19A to 19C are cross-sectional views after depositing a second transparent conductive film on the structure in FIGS. 18A to 18C.

Step 35: deposition a second transparent conductive film 700 on the structure in FIGS. 18A to 18C, as shown in FIGS. 19A to 19C.

Figures 20A, 20B, 20C:
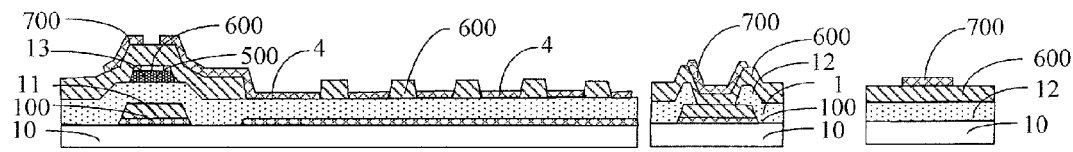
FIGS. 20A to 20C are cross-sectional views after performing a lifting-off process with respect to the structure in FIGS. 19A to 19C.

Step 36: performing a lifting-off process with respect to the structure in FIGS. 19A to 19C, and removing the second transparent conductive film on the photoresist at the same time as peeling off the photoresist to form the pattern of the pixel electrodes 4, as shown in FIGS. 20A to 20C.

Figures 21A, 21B, 21C:
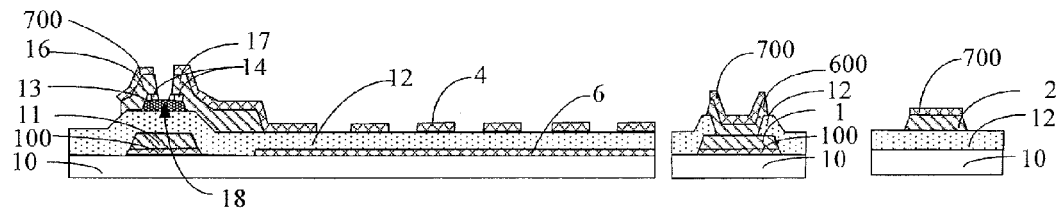
FIGS. 21A to 21C are cross-sectional views after performing a sixth etching process and a seventh etching process with respect to the structure in FIGS. 20A to 20C.

Step 37: performing a sixth etching process with respect to the structure in FIGS. 20A to 20C to remove the exposed second metal film 600 and the exposed impurity-doped semiconductor film 500 and form patterns of the TFT channels 18, the source electrodes 16 and the drain electrodes 17, as shown in FIGS. 21A to 21C. In this step, the sixth etching process can comprise a two-stage etching. Firstly, the first stage is to remove the second metal film 600 which is not covered by the second transparent conductive film 700 by using a solution for etching the metal material so as to form the source electrodes 16 and the drain electrodes 17. Then the second stage is to etch the exposed impurity-doped semiconductor film 500 by dry etching using an etching gas so as to form patterns of the TFT channels 18.

It is can be seen from the steps 31 to 37 in the third patterning process according to the embodiment of the invention that, the second metal film is deposited firstly and then the second transparent conductive layer is deposited. In other words, the source electrodes and the drain electrodes are formed on the TFT channels and the pixel electrodes are form on the drain electrodes. Therefore, no transparent conductive portion is formed between a source electrode and an active layer (the impurity-doped semiconductor layer and the semiconductor layer), so the signals on the data lines can be transmitted into the TFT channels directly by the source electrodes, and are not blocked by the transparent portion, which would improve the displaying quality of the liquid crystal display device.

Figure 22:
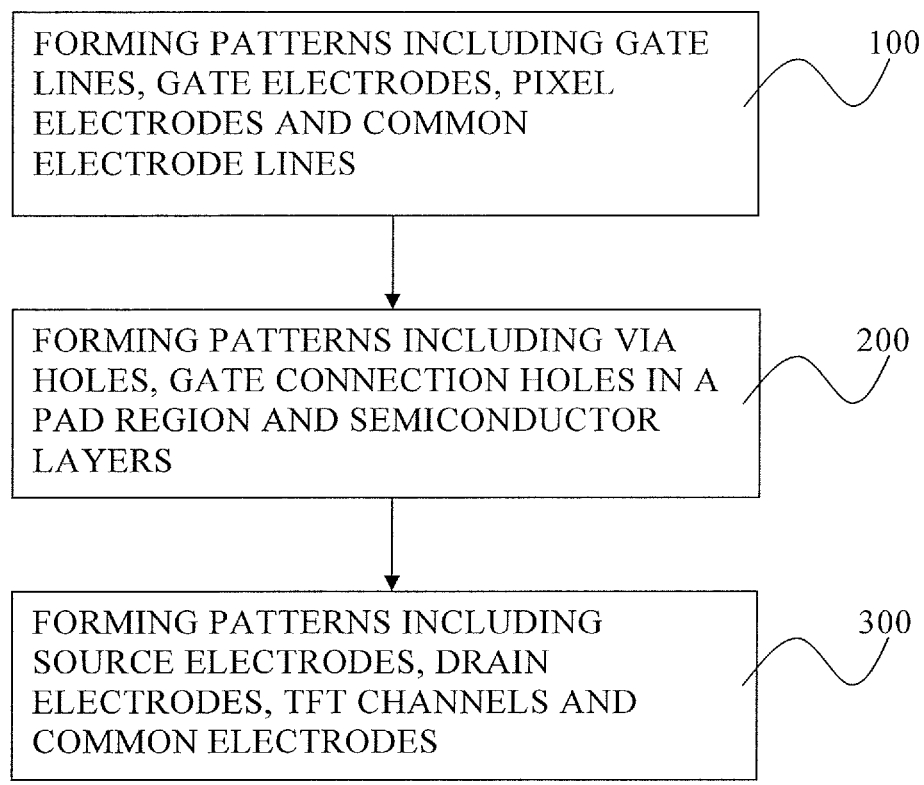
FIG. 22 is a flow chart of a method for manufacturing an array substrate of an FFS type TFT-LCD according to a second embodiment of the invention.

FIG. 22 is a flow chart showing a method for manufacturing an array substrate of the FFS type TFT-LCD according to a second embodiment of the invention. As shown in FIG. 22, the method for manufacturing the array substrate of the FFS type TFT-LCD according to the second embodiment of the invention comprises:

Step 100: forming a first transparent conductive film and a first metal film on a transparent substrate sequentially, and then patterning the stack of the first transparent conductive film and the first metal film so as to form patterns including gate lines, gate electrodes, pixel electrodes and common electrode lines;

Step 200: forming a gate insulating film, a semiconductor film and an impurity-doped semiconductor film sequentially, and then patterning the stack of the gate insulating film, the semiconductor film and the impurity-doped semiconductor film so as to form patterns including via holes, gate connection holes in the PAD region and a semiconductor layer;

Step 300: depositing a second metal film, patterning the second metal film, then depositing a second transparent conductive film and performing a lifting-off process so as to remove the second transparent conductive film on the photoresist, and etching the exposed second metal film and the impurity-doped semiconductor film so as to form patterns including source electrodes, drain electrodes, TFT channels and pixel electrodes.

In the method for manufacturing the array substrate of the FFS type TFT-LCD according to the embodiment of the invention, the array substrate of the FFS type TFT-LCD is fabricated by using three patterning processes. The number of the processes is reduced so that the cost is reduced and the market competitive power is improved.

In the following, an example of the method for manufacturing the array substrate of the FFS type TFT-LCD according to the second embodiment of the invention is described in details with reference to FIGS. 23A to 41C.

Firstly, a first patterning process of the method for manufacturing the array substrate of the FFS type TFT-LCD according to the second embodiment of the invention is described in details with reference to FIGS. 23A to 28C. The first patterning process comprises the following steps:

Step 1100: depositing a first transparent conductive film 100 and a first metal film 200 on a transparent substrate 10 sequentially, as shown in FIGS. 23A to 23C.

The first transparent conductive film 100 and the first metal film 200 can be deposited sequentially on the transparent substrate 10 (for example, a glass substrate or a silica substrate) by using a plasma enhanced chemical vapor deposition (PECVD), magnetism controlled sputter, thermal evaporation or the other film-forming method. The first transparent conductive film 100 can be made of transparent conductive material such as ITO, IZO or the like. The firs metal film 200 can be a single layer film of a metal such as Molybdenum, Aluminum, Neodymium and Aluminum alloy, Tungsten, Chromium, Copper or the like, or multiple layers film by depositing the above metals in layers.

Step 1200: applying a layer of photoresist 1000 on the structure in FIGS. 23A to 23C firstly, and performing an exposing and developing process by using a first half tone mask so as to obtain the photoresist pattern as shown in FIGS. 24A to 24C. The half tone mask can be divided into a transparent region, a semi-transparent region and an opaque region according to the transmission ratio or intensity of light. After performing an exposure process by using the half tone mask, the photoresist 1000 is formed with a totally exposed region, a partially exposed region and an unexposed region. Then, after performing a development process, the photoresist in the totally exposed region is washed out by a solution; for the photoresist in the partially exposed region, the upper layer is exposed and then washed out, thus the lower layer of the photoresist is left so that the thickness of the photoresist is decreased; the thickness of the photoresist in the unexposed region remains. In the photoresist 1000, the unexposed region corresponds to the regions of the gate lines, the gate electrodes and the common electrode lines of the array substrate; the partially exposed region corresponds to the region of the pixel electrodes of the array substrate, and the totally exposed region corresponds to the other regions of the array substrate. In the second embodiment, as compared with the first embodiment, position of the formed pixel electrodes is exchanged with that of the formed common electrode. In addition, the slits are disposed in the pixel electrodes in the first embodiment and the slits are disposed in the common electrodes in the second embodiment.

Step 1300: performing a first etching process with respect to the structure in FIGS. 24A to 24C to form patterns including the gate lines 1, the gate electrodes 11, the pixel electrodes 4 and the common electrode lines, as shown in FIGS. 25A to 25C. The first etching process can comprise a two-stage etching. The first stage is to etch the first metal film 200 to obtain patterns of the gate lines 1, the gate electrodes 11 and the common electrode lines (not shown) by using a solution (for example, a mixture of phosphorous acid and nitric acid) for etching the metal material. The wet etching for etching the pattern having a large area is to immerse the object to be etched into an etching solution so that the exposed portions of the object to be etched are etched away by the etching solution. The solution for etching the metal material can etch off only the metal, i.e. the firs metal film, thus the regions covered by the photoresist, i.e., the first metal film in the partially exposed region and the unexposed region, are not etched. Only the first metal film 200 in the totally exposed region are etched off because of direct contact with the etching solution, and the patterns of the gate lines, the gate electrodes and the common electrode lines are formed by the residual first metal film 200. The second stage is to etch the first transparent conductive film 100 by using a solution for etching ITO or IZO so as to form a pattern of the pixel electrodes 4. In addition, it can be avoided that the gate lines, the gate electrodes and the common electrode lines are connected electrically via the first transparent conductive film 100.

Step 1400: performing an ashing process with respect to the photoresist 1000 in FIGS. 25A to 25C to expose the first metal film 200 in the partially exposed region, as shown in FIGS. 26A to 26C. The ashing process has a function of removing a certain thickness of the photoresist. In this step, the removed photoresist has the same thickness as the thickness of the photoresist in the partially-exposed region in the step 1200. That is, after the ashing process, the photoresist remains in the unexposed region, and no photoresist is left in other regions.

Step 1500: performing a second etching process with respect to the structure in FIGS. 26A to 26C to remove the first metal film 200 exposed in the step 1400, as shown in FIGS. 27A to 27C. The second metal film 200 above the pixel electrodes 4 is removed to expose the pixel electrodes 4.

Step 1600: removing the residual photoresist 1000 in the structure in FIGS. 27A to 27C, as shown in FIGS. 28A to 28C.

The first patterning process is completed through the steps 1100 to 1600.

In the following, a second patterning process of the method for manufacturing the array substrate of the FFS type TFT-LCD according to the second embodiment of the invention is described in details with reference to FIGS. 29A to 34C. The second patterning process can comprise the following steps:

Step 2100: depositing a gate insulating film 300, a semiconductor film 400 and an impurity-doped semiconductor film 500 on the structure in FIGS. 28A to 28C, as shown in FIGS. 29A to 29C.

Step 2200: applying a layer of photoresist 2000 to the structure in FIGS. 29A to 29C, and performing an exposing and developing process by using a second half tone mask to obtain the photoresist patterns as shown in FIGS. 30 to 30C. In the photoresist 2000, the unexposed region corresponds to a region of the TFT channels 18 (see FIG. 21A), the totally exposed region corresponds to a region of the via holes (through which connection wires 4' (see FIG. 41A) can pass and by which the drain electrodes and the pixel electrodes are connected electrically) and the gate lines 1 in the PAD region of the array substrate, and the partially exposed region corresponds to the other regions.

Step 2300: performing a third etching process with respect to the structure in FIGS. 30A to 30C to remove the impurity-doped semiconductor film 500, the semiconductor film 400 and the gate insulating film 300 in the totally exposed region of the photoresist 2000, expose a part of the pixel electrodes 4 and the gate lines 1 in the PAD region and form patterns of the via holes, the connection holes of the gate lines in the PAD region and the gate insulating layer 12, as shown in FIGS. 31A to 31C. The third etching process comprises a three-stage etching. The first stage is to remove the exposed impurity-doped semiconductor film 500, the second stage is to remove the exposed semiconductor film 400, and the third stage is to remove the exposed gate insulating film 300. The solution and the method used in the etching process can be any one of conventional methods in this field and thus the detailed description is omitted.

Step 2400: performing an ashing process with respect to the photoresist 2000 in FIGS. 31A to 31C, to expose the impurity-doped semiconductor film 500 in the partially exposed region, as shown in FIGS. 32A to 32C. In this step, the ashing process can remove the photoresist 2000 in the partially exposed region in the step 2200 to expose the impurity-exposed semiconductor film 500 in the partially-exposed region and leave the photoresist in the unexposed region.

Step 2500: performing a fourth etching process with respect to the structure in FIGS. 32A to 32C to remove the impurity-doped semiconductor film 500, the semiconductor film 400 and the gate insulating film 300 in the partially exposed region and form patterns including the semiconductor layer 13, as shown in FIGS. 33A to 33C.

Figures 34A, 34B, 34C:
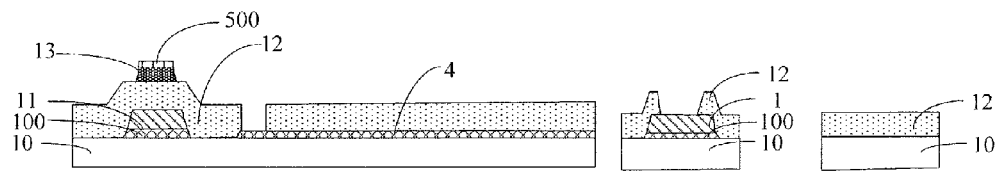
FIGS. 34A to 34C are cross-sectional views after peeling off the photoresist in FIGS. 33A to 33C.

Step 2600: peeling off the residual photoresist 2000 in FIGS. 33A to 33C, as shown in FIGS. 34A to 34C.

The second patterning process is completed through the steps 2100 to 2600.

Figures 35A, 35B, 35C:
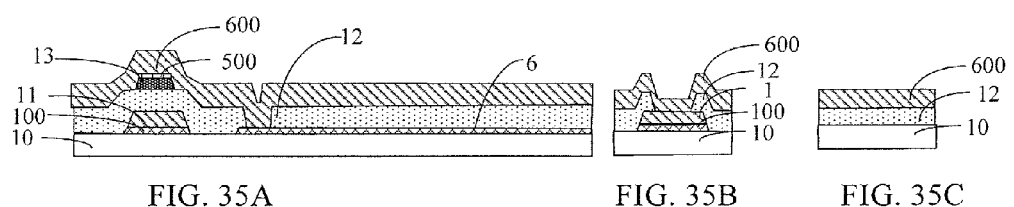
FIGS. 35A to 35C are cross-sectional views after depositing a second metal film on the structure in FIGS. 34A to 34C.

In the following, a third patterning process of the method for manufacturing the array substrate of the FFS type TFT-LCD according to the second embodiment of the invention is described in details with reference to FIGS. 35A to 41C. The third patterning process can comprise the following steps:

Step 3100: deposition a second metal film 600 on the structure in FIGS. 34A to 34C, as shown in FIGS. 35A to 35C.

Figures 36A, 36B, 36C:
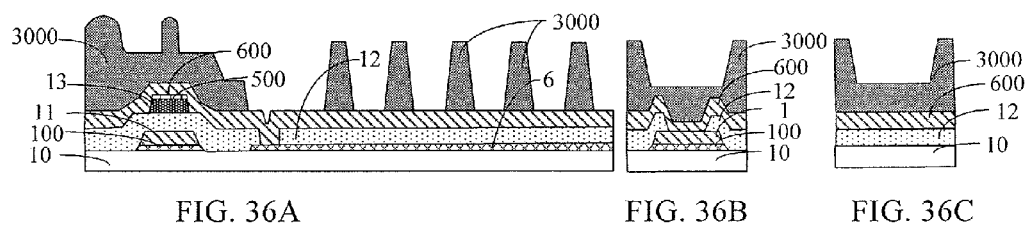
FIGS. 36A to 36C are cross-sectional views after performing exposure and development processes with respect to the structure in FIGS. 35A to 35C applied with photoresist.

Step 3200: applying a layer of photoresist 3000 on the structure in FIGS. 35A to 35C, and performing an exposing and developing process by using a third half tone mask to obtain the photoresist patters as shown in FIGS. 36A to 36C. In the photoresist 3000, the totally exposed region corresponds to a region of the common electrodes 6 of the array substrate, the partially exposed region corresponds to regions of the source electrodes 16 (see FIG. 21B), the drain electrodes 17 and the gate lines 1 in the PAD region, the data lines 2 in the PAD region (see FIG. 1A) and the common electrode lines in the PAD region, and the unexposed region corresponds to the other regions.

Figures 37A, 37B, 37C:
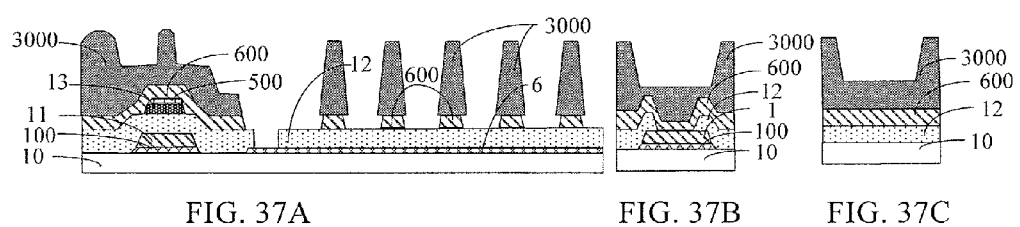
FIGS. 37A to 37C are cross-sectional views after performing a fifth etching process with respect to the structure in FIGS. 36A to 36C.

Step 3300: performing a fifth etching process with respect to the structure in FIGS. 36A to 36C to remove the second metal film 600 in the totally exposed region, as shown in FIGS. 37A to 37C.

Figures 38A, 38B, 38C:
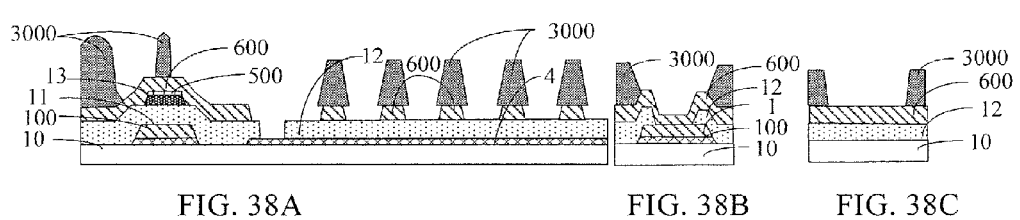
FIGS. 38A to 38C are cross-sectional views after performing an ashing process with respect to the photoresist in FIGS. 37A to 37C.

Step 3400: performing an ashing process with respect to the photoresist 3000 in FIGS. 37A to 37C to expose the second metal film 600 in the partially exposed region, as shown in FIGS. 38A to 38C. In the step, the ashing process can remove the photoresist 3000 in the partially exposed region in the step 3200 to expose the second metal film 600 in the partially-exposed region and leave the photoresist in the unexposed region.

Step 3500: deposition a second transparent conductive film 700 on the structure in FIGS. 18A to 18C, as shown in FIGS. 19A to 19C.

Figures 39A, 39B, 39C:
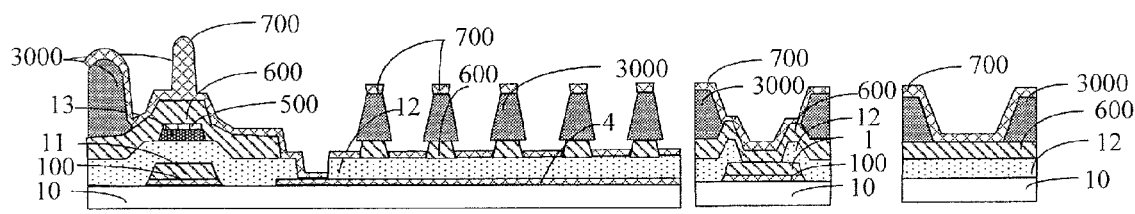
FIGS. 39A to 39C are cross-sectional views after depositing a second transparent conductive film on the structure in FIGS. 38A to 38C.
Figures 40A, 40B, 40C:
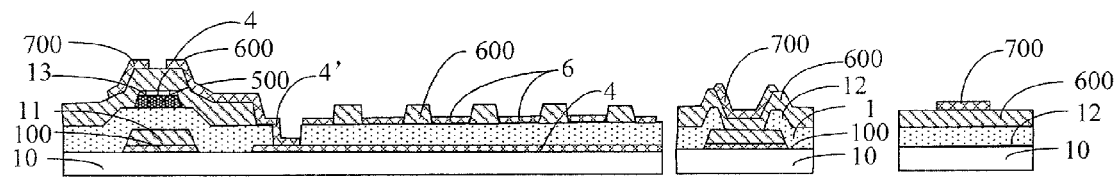
FIGS. 40A to 40C are cross-sectional views after performing a lifting-off process with respect to the structure in FIGS. 39A to 39C.

Step 3600: performing a lifting-off process with respect to the structure in FIGS. 39A to 39C, and forming patterns of the connection wires 4' for connecting the drain electrodes and the pixel electrodes and the common electrodes 6, as shown in FIGS. 40A to 40C.

Figures 41A, 41B, 41C:
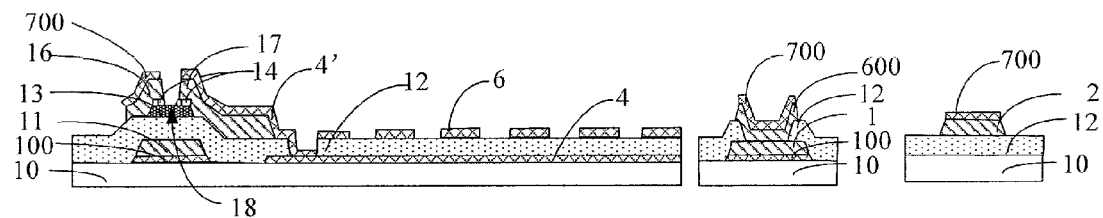
FIGS. 41A to 41C are cross-sectional views after performing a sixth etching process and a seventh etching process with respect to the structure in FIGS. 40A to 40C.

Step 3700: performing a sixth etching process with respect to the structure in FIGS. 40A to 40C to remove the exposed second metal film 600 and the exposed impurity-doped semiconductor film 500 and form patterns of the TFT channels 18, the source electrodes 16 and the drain electrodes 17, as shown in FIGS. 41A to 41C. In this step, the sixth etching process can comprise a two-stage etching. Firstly, the first stage is to remove the second metal film 600 which is not covered by the second transparent conductive film 700 by using a solution for etching the metal material so as to form the source electrodes 16 and the drain electrodes 17. Then the second stage is to etch the exposed impurity-doped semiconductor film 500 by dry etching using an etching gas so as to form patterns of the TFT channels 18. The third patterning process is completed through the steps 3100 to 3700.

In the method for manufacturing the array substrate of the FFS type TFT-LCD according to the embodiments of the invention, no passivation layer is formed, thus the material is reduced and the array substrate can be lighter. In addition, since there is no passivation layer on the array substrate, the obtained liquid crystal display can realize given rotation requirement of the liquid crystal material by using lower driving voltage.

Here, it should be noted that, the patterning or the patterning process described can include the processes of applying the photoresist, exposing the photoresist by using a mask, developing the obtain photoresist pattern, etching by using the photoresist pattern, peeling off the residual photoresist or the like. In the above description, positive type photoresist is described as an example. If negative type photoresist is used, then after developing, the photoresist in the totally exposed region is totally left, the photoresist in the unexposed region is totally removed, and the photoresist in the partially exposed region is partially left.

The terms of "a region" or "the region" here is a region in which a pattern is mapped on the array substrate. In other words, the region has the same shape as that of the pattern. For example, the region of the gate lines is a region in which the pattern of the gate lines is mapped on the array substrate, or a region in which the pattern of the gate lines is disposed on the array substrate.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method for manufacturing an array substrate of a fringe-field switching (FFS) type thin film transistor liquid crystal display (TFT-LCD) comprising:

Step 1: forming a first transparent conductive film and a first metal film on a transparent substrate sequentially, and then patterning the stack of the first transparent conductive film and the first metal film so as to form patterns including gate lines, gate electrodes, common electrodes and common electrode lines;

Step 2: forming a gate insulating film, a semiconductor film and an impurity-doped semiconductor film sequentially, and then patterning the stack of the gate insulating film, the semiconductor film and the impurity-doped semiconductor film so as to form patterns including gate connection holes in the PAD region and a semiconductor layer; and Step 3: Ruining a second metal film, patterning the second metal film, then forming a second transparent conductive film and performing a lifting-off process so as to remove the second transparent conductive film on photoresist, and etching the exposed second metal film and the impurity-doped semiconductor film so as to form patterns including source electrodes, drain electrodes, TFT channels and pixel electrodes.

2. The method for manufacturing an array substrate of an FFS type TFT-LCD according to claim 1, wherein the step 1 comprises:

Step 11: depositing the first transparent conductive film and the first metal film on the transparent substrate sequentially;

Step 12: applying first photoresist, and performing an exposing and developing process by using a first half tone mask so that a photoresist-totally-remaining region of the first photoresist corresponds to regions of the gate lines, the gate electrodes and the common electrode lines of the array substrate, a photoresist-partially-exposed region corresponds to a region of the common electrodes of the array substrate, and a photoresist-totally-removed region corresponds to the other regions;

Step 13: performing a first etching process to remove the first metal film and the first transparent conductive film in the photoresist-totally-removed region and to form patterns including the gate lines, the gate electrodes, the common electrodes and the common electrode lines;

Step 14: performing an ashing process with respect to the first photoresist to expose the first metal film in the photoresist-partially-remaining region;

Step 15: performing a second etching process to remove the first metal film in the photoresist-partially-remaining region and expose the common electrodes; and Step 16: peeling off the residual first photoresist.

3. The method for manufacturing an array substrate of an FFS type TFT-LCD according to claim 1, wherein the step 2 comprises:

Step 21: depositing the gate insulating film, the semiconductor film and the impurity-doped semiconductor film on the structure in the step 1;

Step 22: applying second photoresist and performing an exposing and developing process by using a second half tone mask so that a photoresist-totally-remaining region of the second photoresist corresponds to a region of the TFT channels, a photoresist-totally-removed region corresponds to a region of the gate lines in the PAD region of the array substrate, and a photoresist-partially-remaining region corresponds to the other regions;

Step 23: performing a third etching process to remove the impurity-doped semiconductor film, the semiconductor film and the gate insulating film in the photoresist-totally-removed region, expose the gate lines in the PAD region and form patterns of connection holes of the gate lines in the PAD region and the gate insulating layer;

Step 24: performing an ashing process with respect to the second photoresist to expose the impurity-doped semiconductor film in the photoresist-partially-remaining region;

Step 25: performing a fourth etching process to remove the impurity-doped semiconductor film, the semiconductor film and the gate insulating film in the photoresist-partially-remaining region and form patterns including the semiconductor layer; and Step 26: peeling off the residual second photoresist.

4. The method for manufacturing an array substrate of an FFS type TFT-LCD according to claim 1, wherein the step 3 comprises:

Step 31: deposition a second metal film on the structure obtained in the step 2;

Step 32: applying third photoresist and performing an exposing and developing process by using a third half tone mask so that a photoresist-totally-removed region of the third photoresist corresponds to a region of the pixel electrodes of the array substrate, a photoresist-partially-remaining region corresponds to regions of the source electrodes, the drain electrodes, the gate lines in the PAD region, the data lines in the PAD region and the common electrode lines in the PAD region, and a photoresist-totally-remaining region corresponds to the other regions;

Step 33: performing a fifth etching process to remove the second metal film in the photoresist-totally-removed region;

Step 34: performing an ashing process with respect to the third photoresist to expose the second metal film in the photoresist-partially-remaining region;

Step 35: deposition a second transparent conductive film;

Step 36: performing a lifting-off process to remove the second transparent conductive film on the residual third photoresist and form the pattern of the pixel electrodes; and Step 37: performing a sixth etching process to remove the exposed second metal film and the exposed impurity-doped semiconductor film and form patterns of the source electrodes, the drain electrodes and the TFT channels.

5. A method for manufacturing an array substrate of a fringe-field switching (FFS) type thin field transistor liquid crystal display (TFT-LCD) comprising:

Step 100: forming a first transparent conductive film and a first metal film on a transparent substrate sequentially, and then patterning the stack of the first transparent conductive film and the first metal film so as to form patterns including gate lines, gate electrodes, pixel electrodes and common electrode lines;

Step 200: forming a gate insulating film, a semiconductor film and an impurity-doped semiconductor film sequentially, and then patterning the stack of the gate insulating film, the semiconductor film and the impurity-doped semiconductor film so as to form patterns including via holes, gate connection holes in the PAD region and a semiconductor layer; and Step 300: depositing a second metal film, patterning the second metal film, then depositing a second transparent conductive film and performing a lifting-off process so as to remove the second transparent conductive film on photoresist, and etching the exposed second metal film and the impurity-doped semiconductor film so as to form patterns including source electrodes, drain electrodes. TFT channels and common electrodes.

6. The method for manufacturing an array substrate of an FFS type TFT-LCD according to claim 5, wherein the step 100 comprises:

Step 1100: depositing the first transparent conductive film and the first metal film on the transparent substrate sequentially;

Step 1200: applying first photoresist, and performing an exposing and developing process by using a first half tone mask so that a photoresist-totally-remaining region of the first photoresist corresponds to regions of the gate lines, the gate electrodes and the common electrode lines of the array substrate, a photoresist-partially-exposed region corresponds to a region of the pixel electrodes of the array substrate, and a photoresist-totally-removed region corresponds to the other regions;

Step 1300: performing a first etching process to remove the first metal film and the first transparent conductive film in the photoresist-totally-removed region and to form patterns including the gate lines, the gate electrodes, the pixel electrodes and the common electrode lines;

Step 1400: performing an ashing process with respect to the first photoresist to expose the first metal film in the photoresist-partially-remaining region;

Step 1500: performing a second etching process to remove the first metal film in the photoresist-partially-remaining region and expose the pixel electrodes; and Step 1600: peeling off the residual first photoresist.

7. The method for manufacturing an array substrate of an FFS type TFT-LCD according to claim 5, wherein the step 200 comprises:

Step 2100: depositing the gate insulating film, the semiconductor film and the impurity-doped semiconductor film on the structure in the step 100;

Step 2200: applying second photoresist and performing an exposing and developing process by using a second half tone mask so that a photoresist-totally-remaining region of the second photoresist corresponds to a region of the TFT channels, a photoresist-totally-removed region corresponds to a region of the via holes and the gate lines in the PAD region of the array substrate, and a photoresist-partially-remaining region corresponds to the other regions;

Step 2300: performing a third etching process to remove the impurity-doped semiconductor film, the semiconductor film and the gate insulating film in the photoresist-totally-removed region, expose a part of the pixel electrodes and the gate lines in the PAD region and form patterns of via holes, the connection holes of the gate lines in the PAD region and the gate insulating layer;

Step 2400: performing an ashing process with respect to the second photoresist to expose the impurity-doped semiconductor film in the photoresist-partially-remaining region;

Step 2500: performing a fourth etching process to remove the impurity-doped semiconductor film, the semiconductor film and the gate insulating film in the photoresist-partially-remaining region and form patterns including the semiconductor layer; and Step 2600: peeling off the residual second photoresist.

8. The method for manufacturing an array substrate of an FFS type TFT-LCD according to claim 5, wherein the step 300 comprises:

Step 3100: deposition a second metal film on the structure obtained in the step 200;

Step 3200: applying third photoresist and performing an exposing and developing process by using a third half tone mask so that a photoresist-totally-removed region of the third photoresist corresponds to a region of the common electrodes of the array substrate, a photoresist-partially-remaining region corresponds to regions of the source electrodes, the drain electrodes, the gate lines in the PAD region, the data lines in the PAD region and the common electrode lines in the PAD region, and a photoresist-totally-remaining region corresponds to the other regions;

Step 3300: performing a fifth etching process to remove the second metal film in the photoresist-totally-removed region;

Step 3400: performing an ashing process with respect to third the photoresist to expose the second metal film in the photoresist-partially-remaining region;

Step 3500: deposition a second transparent conductive film;

Step 3600: performing a lifting-off process to remove the second transparent conductive film on the residual third photoresist and form patterns of the common electrodes and connection lines for connecting the drain electrodes and the pixel electrodes; and Step 3700: performing a sixth etching process to remove the exposed second metal film and the exposed impurity-doped semiconductor film and form patterns including the source electrodes, the drain electrodes and the TFT channels.

\* \* \* \* \*